United States Patent
Kodaira et al.

[11] Patent Number: 6,109,341
[45] Date of Patent: Aug. 29, 2000

[54] ELECTRONIC COMPONENT COOLING APPARATUS INCLUDING ELONGATED HEAT SINK

[75] Inventors: Yuichi Kodaira, Ueda; Toshiki Ogawara, Nagano-ken, both of Japan

[73] Assignee: Sanyo Denki Co., Ltd., Tokyo, Japan

[21] Appl. No.: 09/070,415

[22] Filed: Apr. 30, 1998

[51] Int. Cl.[7] .................................................. F28F 7/00
[52] U.S. Cl. .................... 165/80.3; 165/185; 165/121; 174/16.3; 361/697; 361/704; 257/718; 257/721
[58] Field of Search .................. 165/80.3, 121, 165/185; 174/16.3; 361/703, 704, 709; 257/718

[56] References Cited

U.S. PATENT DOCUMENTS

| | | | |
|---|---|---|---|
| 4,513,812 | 4/1985 | Papst et al. | 165/80 B |
| 5,251,101 | 10/1993 | Liu | 361/717 |
| 5,309,983 | 5/1994 | Bailey | 165/80.3 |
| 5,309,985 | 5/1994 | Bailey | 165/80.3 |
| 5,421,402 | 6/1995 | Lin | 165/80.3 |
| 5,452,181 | 9/1995 | Hoover | 361/697 |
| 5,484,013 | 1/1996 | Morikawa et al. | 565/80.3 |
| 5,494,098 | 2/1996 | Morosas | 165/80.3 |
| 5,519,574 | 5/1996 | Kodama et al. | 361/697 |
| 5,615,998 | 4/1997 | Kodama et al. | 165/80.3 |
| 5,629,834 | 5/1997 | Kodama et al. | 165/80.3 |
| 5,638,895 | 6/1997 | Dodson | 165/121 |
| 5,701,951 | 12/1997 | Jean | 165/80.3 |
| 5,760,333 | 6/1998 | Kitahara et al. | 165/80.3 |
| 5,785,116 | 7/1998 | Wagner | 165/80.3 |
| 5,787,971 | 8/1998 | Dodson | 165/121 |
| 5,794,685 | 8/1998 | Dean | 165/121 |
| 5,828,551 | 10/1998 | Hoshino et al. | 165/80.3 |
| 5,835,347 | 11/1998 | Chu | 361/697 |
| 5,841,633 | 11/1998 | Huang | 361/697 |
| 5,873,406 | 2/1999 | Horng | 165/121 |
| 5,910,694 | 6/1999 | Yokozawa et al. | 361/697 |
| 5,957,659 | 9/1999 | Amou et al. | 361/697 |
| 5,973,921 | 10/1999 | Lin | 361/697 |

FOREIGN PATENT DOCUMENTS

| | | | |
|---|---|---|---|
| 23034 | of 1990 | Japan . | |
| 268125 | of 1994 | Japan . | |
| 83873 | of 1996 | Japan . | |
| 10-209658 | 8/1998 | Japan | 165/80.3 |

*Primary Examiner*—Ira S. Lazarus
*Assistant Examiner*—Terrell McKinnon
*Attorney, Agent, or Firm*—Pearne & Gordon LLP

[57] ABSTRACT

An electronic component cooling apparatus capable of minimizing or substantially preventing a reduction in cooling efficiency even when discharge of air heated is restricted to two directions. The cooling apparatus includes a heat sink including an elongated base having a plurality of radiation fins arranged thereon, as well as a fan unit. The fan unit includes an impeller provided with a plurality of blades, a motor for revolving the impeller and a casing formed with a suction opening for receiving the impeller and motor therein. The casing is releasably mounted on the heat sink. The heat sink and casing of the fan unit cooperate with each other to define two discharge ports on both ends of the base in a longitudinal direction thereof. The casing is provided with a pair of guide extensions for air guide in a manner to extend in a longitudinal direction of the base of the heat sink.

11 Claims, 4 Drawing Sheets

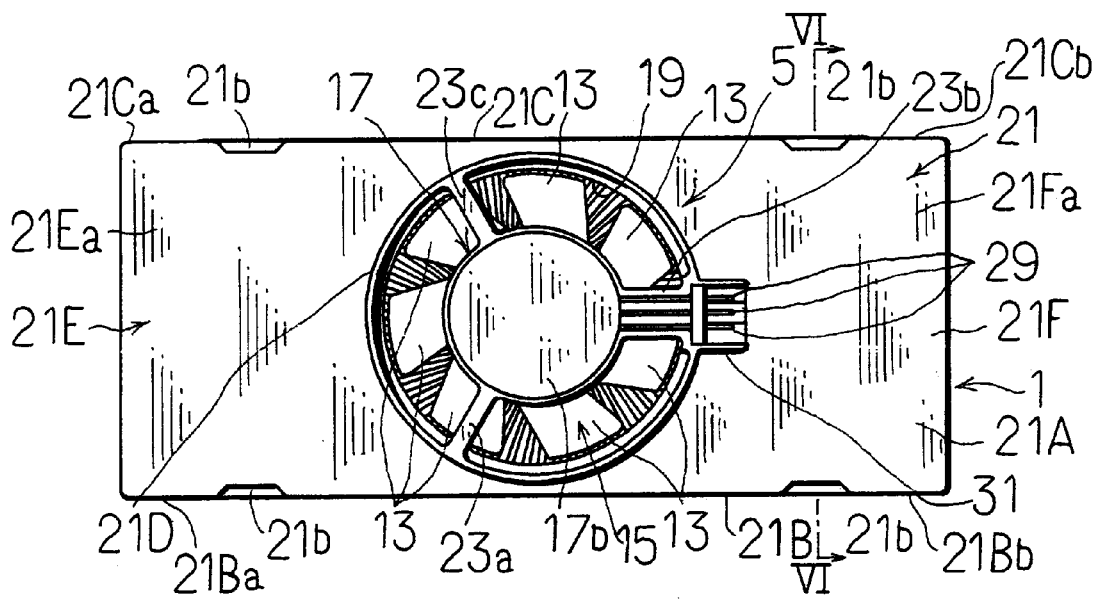
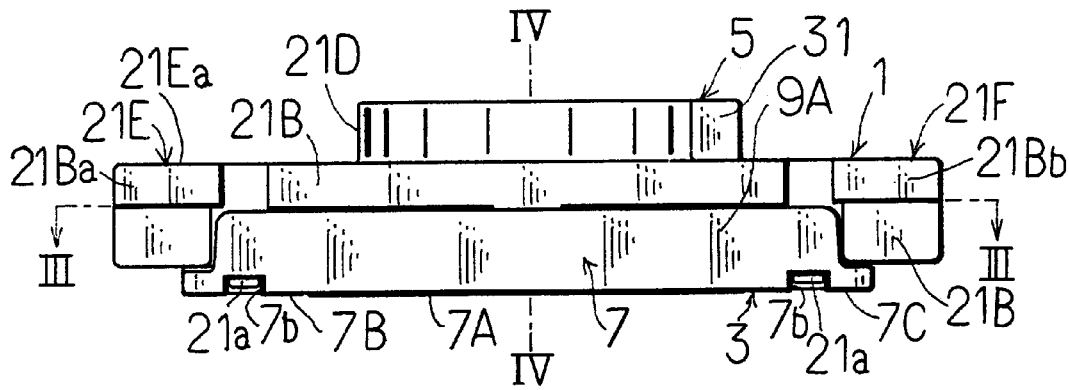
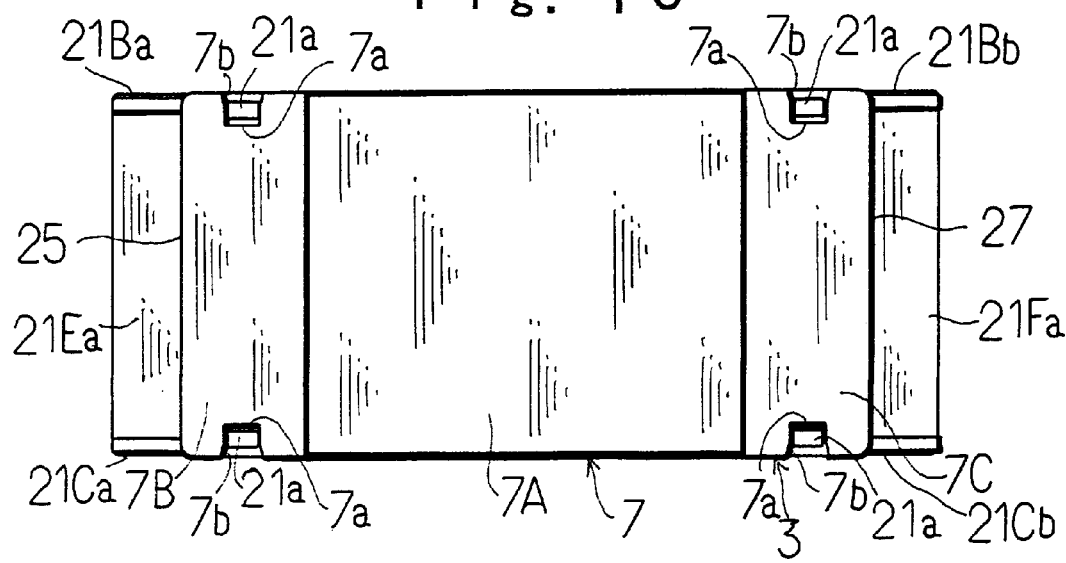

ELECTRONIC COMPONENT COOLING APPARATUS INCLUDING ELONGATED HEAT SINK

BACKGROUND OF THE INVENTION

This invention relates to an electronic component cooling apparatus for cooling an electronic component such as an MPU or the like, and more particularly to an electronic component cooling apparatus of the type that a heat sink on which an electronic component is mounted is forcibly cooled by air fed from a fan unit.

An electronic component cooling apparatus of the type that a heat sink including a plurality of radiation fins and a fan unit are combined with each other has been conventionally known in the art, as typically disclosed in Japanese Patent Application Laid-Open Publication No. 268125/1994, Japanese Patent Application Laid-Open Publication No. 83873/1996, U.S. Pat. Nos. 5,519,574, 5,484,013, 5,452,181, 5,421,402, 5,251,101 and 5,309,983.

An electronic component cooling apparatus disclosed in Japanese Patent Application Laid-Open Publication No. 268125/1994 or U.S. Pat. No. 5,309,983 is so constructed that air sucked by a fan unit is forcibly fed to a heat sink. Also, in the electronic component cooling apparatus disclosed, air discharged from blades of the fan unit being rotated about a revolving shaft of a motor is forcibly fed in a radial direction of the revolving shaft rather than an axial direction thereof, to thereby increase cooling efficiency of the electronic component cooling apparatus.

The conventional electronic component cooling apparatus is typically constructed in such a manner that air which is discharged from the unit fan to absorb heat of the radiation fins, resulting in being heated is guided in all directions from a whole circumference of the heat sink. In this respect, an electronic component cooling apparatus disclosed in U.S. Pat. Nos. 5,309,983 or 5,519,574 and more specifically FIG. 3A of the patent includes a heat sink having a plurality of radiation fins arranged thereon in a manner to be spaced from each other at intervals while being in parallel to each other, resulting in air being discharged in two directions in which the radiations fins extend.

Also, U.S. Pat. No. 4,513,812 discloses an electronic component cooling apparatus which is so constructed that an electronic component generating heat is arranged on an elongated base. The base is provided on a front surface thereof with a plurality of radiation fins extending in a longitudinal direction of the base. The cooling apparatus also includes a fan unit including a cover member having a wall arranged opposite to the base and mounted on the base. In the electronic component cooling apparatus thus constructed, air flow forcibly guided from the fan unit toward the base is discharged through two openings provided on both ends of the base defined in a longitudinal direction thereof. Unfortunately, the cooling apparatus has a disadvantage that the heat sink is significantly increased in size due to arrangement of both electronic component and radiation fins on the base.

Japanese Utility Model Publication No. 23034/1990 discloses an electronic component cooling apparatus which includes a heat sink including a plurality of radiation fins and arranged on an elongated base and a fan unit including a cover member arranged opposite to the base. The radiation fins are arranged so as to permit air fed from the fan unit to be guided in at least one of a width direction of the base perpendicular to a longitudinal direction thereof and an oblique direction between the longitudinal direction and the width direction. Thus, the cooling apparatus permits air to be discharged either in all directions of the elongated base or in a width direction thereof.

U.S. Pat. No. 5,615,998 discloses an electronic component cooling apparatus which is provided with an engagement structure including a plurality of fitting sections provided at a fan unit and a plurality of fitted sections provided at a heat sink and engaged with the fitting sections. The fitting sections and fitted sections are permitted to be engaged with each other by merely approaching the fan unit to the heat sink. Also, the engagement structure of the apparatus includes two engagement members which permit engagement between the fitting sections and the fitted sections to be released when force is applied to ends of the engagement members by two fingers.

An electronic appliance such as a microcomputer or the like in which such an electronic component cooling apparatus is used has been extensively reduced in size, resulting in a space defined around the electronic component cooling apparatus being reduced correspondingly. Thus, when the electronic component cooling apparatus is constructed so as to discharge heated air in all directions from a whole circumference of the apparatus, a temperature of other electronic components arranged around the electronic component cooling apparatus is caused to be increased to a level exceeding an allowable level. In particular, the problem is amplified with an increase in length of the heat sink.

The problem has been conventionally solved only by discharging air heated by the heat sink in two directions defined in the longitudinal direction of the heat sink. Unfortunately, such restriction in direction of discharge of the air causes another disadvantage of reducing cooling efficiency of the electronic component cooling apparatus.

SUMMARY OF THE INVENTION

The present invention has been made in view of the foregoing disadvantage of the prior art.

Accordingly, it is an object of the present invention to provide an electronic component cooling apparatus which is capable of substantially preventing or minimizing a reduction in cooling efficiency of the apparatus while keeping heated air discharged in two directions defined in a longitudinal direction of a heat sink.

It is another object of the present invention to provide an electronic component cooling apparatus which is capable of substantially restraining a fan unit from sucking heated air discharged through two discharge ports.

It is a further object of the present invention to provide an electronic component cooling apparatus which is capable of significantly decreasing the number of parts for the apparatus and facilitating assembling thereof.

It is still another object of the present invention to provide an electronic component cooling apparatus which is capable of facilitating coupling between a casing on which a fan unit is mounted and a heat sink and separation of the thuscoupled casing and heat sink from each other.

In accordance with the present invention, an electronic component cooling apparatus includes a heat sink including an elongated base which has a rear surface mounted thereon with an electronic component to be cooled and a front surface provided thereon with a plurality of radiation fins. The electronic component cooling apparatus also includes a fan unit including an impeller provided with a plurality of blades, a motor including a housing and a revolving shaft fixedly mounted thereon with a rotor on which the impeller is mounted and acting to rotate the impeller, a casing provided with a suction opening for receiving the impeller and motor therein and including a horizontal wall arranged opposite to the front surface of the base of the heat sink, and a plurality of webs for connecting the housing of the motor and the casing to each other so as to position the motor at a central portion of the suction opening. The blades are constructed so as to suck air from an outside of the suction opening through the suction opening toward the base. The heat sink and the casing of the fan unit cooperate with each other to cool the radiation fins of the heat sink by means of air discharged from the impeller being rotated and define two discharge ports on both ends of the base defined in a longitudinal direction thereof. The casing is provided with a pair of guide extensions for air guide which are arranged so as to extend beyond the discharge ports to the both ends of the base in the longitudinal direction thereof.

An increase in length of the base of the heat sink causes an increase in weight of the electronic component cooling apparatus, as well as an increase in manufacturing cost of the apparatus. The construction of the present invention that a pair of the guide extensions for further guiding air discharged from the discharge ports in the longitudinal direction of the base are arranged on the casing restrains air heated by the heat sink and discharged from the discharge ports from being sucked directly from the suction opening without excessively increasing a length of the base of the heat sink. This enhances efficiency in heat dissipation of the electronic component cooling apparatus. A length of the guide extensions may be determined by an experiment.

There would often occur a necessity of replacing the fan unit due to a failure of the motor or a circuit incorporated in the apparatus, or the like. Thus, is desirable that coupling between the casing of the fan unit and the heat sink is releasable. For example, when the casing includes an elongated horizontal wall arranged so as to be opposite to the front surface of the base of the heat sink while being spaced therefrom at a predetermined interval, a pair of side walls arranged so as to extend toward the heat sink from both sides of the horizontal wall extending in a longitudinal direction thereof, and an annular wall arranged so as to extend in a direction away from the heat sink to define the suction opening therein; a plurality of fitting portions may be arranged on the side walls of the casing in a manner to be spaced from each other at predetermined intervals in the longitudinal direction of the base. Also, the base of the heat sink or each of the side walls of the heat sink includes a plurality of fitted portions engaged with the fitting portions. Also, the guide extensions each are constituted by a horizontal extension section extending from the horizontal wall of the casing and a pair of side extension sections extending from each of side walls of the casing. The fitting portions and fitted portions are so constructed that engagement between the fitting portions and the fitted portions is released by separating the casing from the heat sink while applying force to the side extension sections of the guide extensions in directions toward each other. Such construction permits the guide extensions to act also as an operation section through which force is applied during releasing of the engagement, to thereby simplify a structure of the electronic component cooling apparatus.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIG. 1A is a plan view showing an embodiment of an electronic component cooling apparatus according to the present invention;

FIG. 1B is a front elevation view of the electronic component cooling apparatus shown in FIG. 1A;

FIG. 1C is a bottom view of the electronic component cooling apparatus shown in FIG. 1B;

DETAILED DESCRIPTION OF THE PREFERRED EMBODIMENTS

Figure 2A:
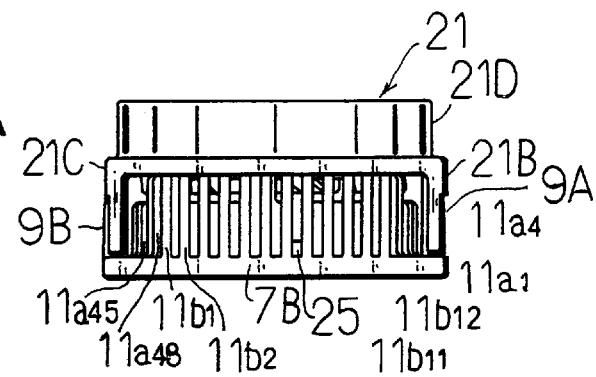
FIG. 2A is a right-side elevation view of the electronic component cooling apparatus shown in FIG. 1A.
Figure 2B:
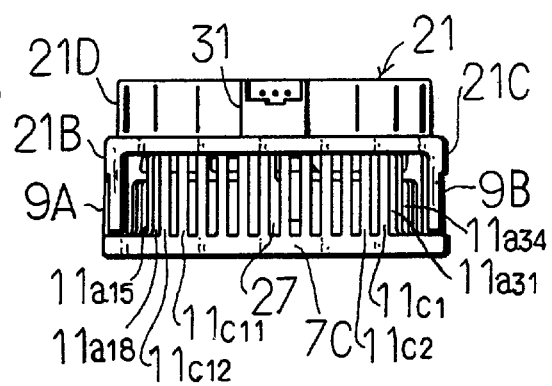
FIG. 2B is a left-side elevation view of the electronic component cooling apparatus shown in FIG. 1A.

Now, an electronic component cooling apparatus according to the present invention will be described hereinafter with reference to the accompanying drawings.

Referring first to FIGS. 1A to 4, an embodiment of an electronic component cooling apparatus according to the present invention is illustrated. An electronic component cooling apparatus of the illustrated embodiment which is generally designated at reference numeral 1 generally includes a heat sink 3 made of aluminum and a fan unit 5 mounted on the heat sink 3.

The heat sink 3 includes an elongated base 7 and a pair of side walls 9A and 9B arranged on both sides of the base in a lateral direction thereof perpendicular to a longitudinal direction thereof so as to horizontally extend in the longitudinal direction of the base and vertically extend toward the fan unit 5. The base 7 and side walls 9A and 9B are formed in a manner to be integral with each other. The base 7 is provided on a rear surface thereof with an electronic component mounting section 7A on which an electronic component is mounted, as well as a pair of extensions 7B and 7C. The extensions 7B and 7C are arranged on both lateral sides of the electronic component mounting section 7A in a manner to be integral with the section 7A. The electronic component mounting section 7A is arranged so as to somewhat downwardly project from the rear surface of the base 7 as compared with the extensions 7B and 7C. An electronic component to be cooled may be mounted on the electronic component mounting section 7A either directly or through a connector. Mounting of the electronic component on the electronic component mounting section 7A may be carried out either by means of an adhesive of increased thermal conductivity or by screwing.

Figure 3:
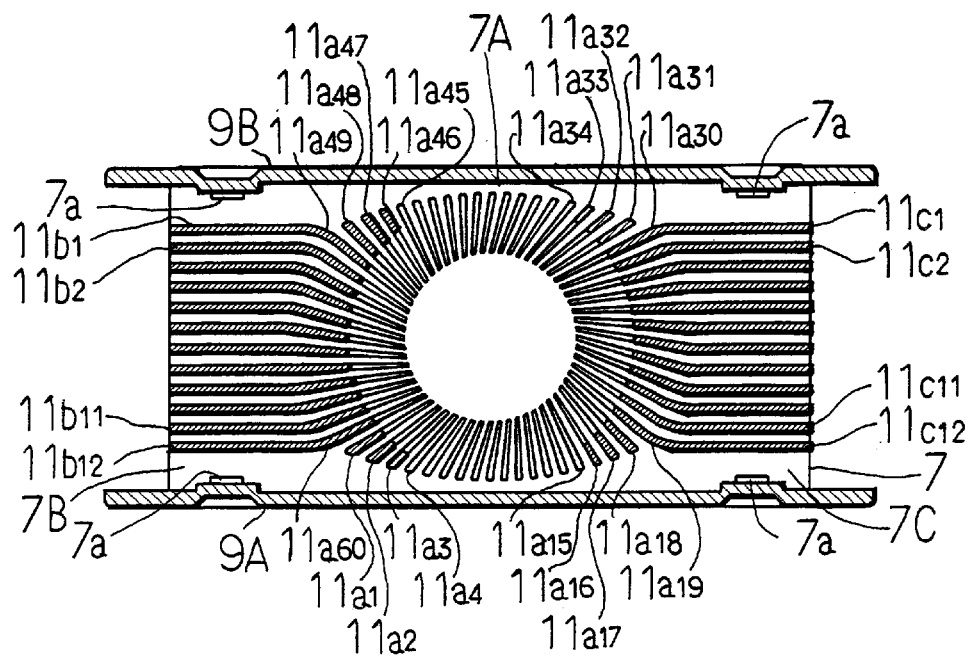
FIG. 3 is a sectional view taken along line III—III of FIG. 1B.

The base 7, as best seen in FIG. 3, is integrally provided on a front surface thereof with a plurality of radiation fins. The radiation fins include sixty radiation fins 11*a*1 to 11*a*60 arranged on a front surface of the electronic component mounting section 7A, twelve radiation fins 11*b*1 to 11*b*12 arranged on a front surface of the first extension 7B, and twelve radiation fins 11c1 to 11c12 arranged on a front surface of the second extension 7B. The radiation fins 11a5 to 11a14, 11a35 to 11a44, 11b3 to 11b10, and 11c3 to 11c10 are omitted in FIG. 3 for the sake of brevity. Sixty such radiation fins 11a1 to 11a60 are arranged in an annular manner, wherein the radiation fins 11a4 to 11a15 and 11a34 to 11a45 are formed into a height which permits the radiation fins to be arranged below an impeller 15 of the fan unit 5 including a plurality of blades 13. The radiation fins 11a4 to 11a15 and 11a34 to 11a45 are cooled directly by air discharged essentially in an axial direction of a motor 17 from the fan unit 5. The remaining radiation fins 11a46 to 11a3 and 11a16 to 11a33 each are so arranged that the an inner portion thereof is formed into a height which permits it to be arranged below the impeller 15 (or blades 13) of the fan unit 5 and an outer portion thereof is formed into a height which permits it to surround an outer periphery of the impeller 15. In particular, the radiation fins 11a46 to 11a3 and 11a16 to 11a33 are arranged so as to minimize interruption of flowing of air discharged in a radial direction of a revolving shaft 17a of the motor 17 of the fan unit 5. This permits the outer portion of each of the radiation fins 11a46 to 11a3 and 11a16 to 11a33 to be cooled directly by air discharged in the radial direction of the revolving shaft 17a of the motor 17. The radiation fins 11a1 to 11a60 are arranged in an inclined manner rather than in a radial manner, to thereby define a part of a vortex. In the illustrated embodiment, the radiation fins 11a46 to 11a3 and 11a16 to 11a33 constitute a first radiation fin group and the radiation fins 11a4 to 11a15 and 11a34 to 11a45 constitute a fourth radiation fin group.

The radiation fins 11b1 to 11b12 arranged on the front surface of the first extension 7B of the heat sink 3 are arranged so as to linearly or straightly extend toward an end of the extension 7B. Also, the radiation fins 11b1 to 11b12 are arranged so as to be spaced from each other at substantially equal intervals in a width direction of the heat sink 3 perpendicular to the longitudinal direction thereof while being kept parallel to each other. The radiation fins 11b1 to 11b12 are connected at an inner end thereof to the radiation fins 11a49 to 11a60, respectively. Such arrangement of the radiation fins provides flow passages independent from each other each of which extends commonly between each adjacent two of the radiation fins 11a49 to 11a60 and between each adjacent two of the radiation fins 11b1 to 11b12 corresponding to such each adjacent two of the radiation fins 11a49 to 11a60. Likewise, the radiation fins 11c1 to 11c12 provided on the front surface of the second extension 7C of the heat sink 3 are arranged so as to linearly extend toward an end of the extension 7C. Also, the radiation fins 11c1 to 11c12 are arranged so as to be spaced from each other at substantially equal intervals in the width direction of the heat sink 3 while being kept parallel to each other. The radiation fins 11c1 to 11c12 are connected at an inner end thereof to the radiation fins 11a30 to 11a19, respectively. This results in flow passages independent from each other each of which extends commonly between each adjacent two of the radiation fins 11a30 to 11a19 and between each adjacent two of the radiation fins 11c1 to 11c12 corresponding to such each adjacent two of the radiation fins 11a49 to 11a60 being defined. In the illustrated embodiment, the radiation fins 11b1 to 11b12 constitute a second radiation fin group and the radiation fins 11c1 to 11c12 constitute a third radiation fin group.

Such first to third radiation fin groups significantly enhances heat dissipation of the heat sink 3 even when two discharge ports or outlets are arranged. Also, in the illustrated embodiment, plural ones of the radiation fins contained in the second and third radiation fins are connected to plural ones of the radiation fins contained in the first radiation fin group, resulting in the independent flow passage being defined so as to extend commonly between each adjacent two fins connected. This permits air to be reduced in flow resistance, to thereby further enhance heat dissipation of the heat sink 3.

In particular, the radiation fins having hatching drawn thereon in FIG. 3 are formed into a height which permits the radiation fins to be substantially contacted with an inner surface of a casing 21 of the fan unit 5 opposite thereto.

Figure 4:
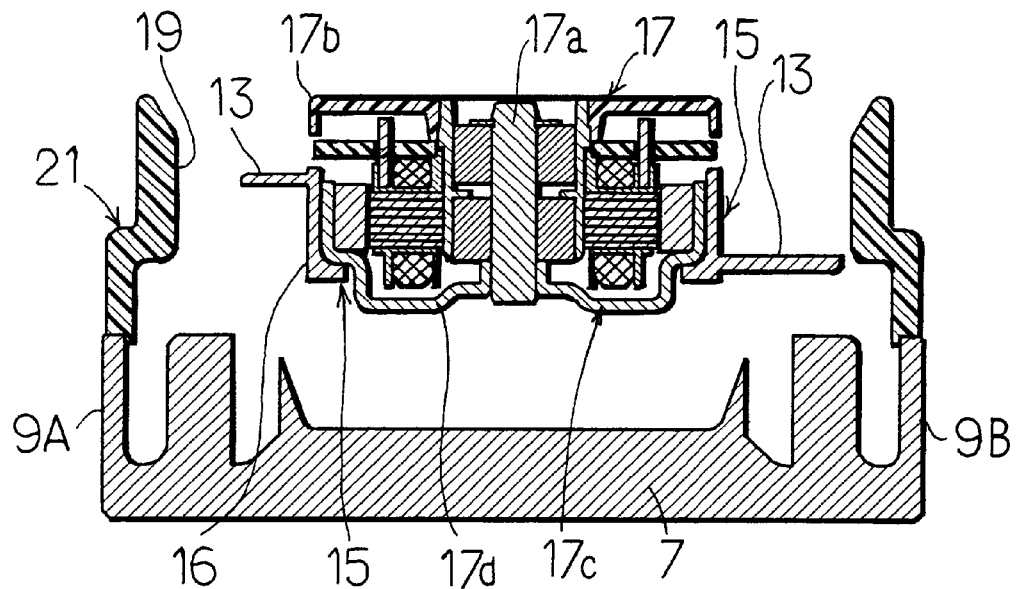
FIG. 4 is a sectional view taken along line IV—IV of FIG. 1B.

The fan unit 5, as shown in FIG. 5(A), includes the impeller 15 including seven such blades 13 described above, the motor 17 having the above-described revolving shaft 17a fixedly mounted thereon with the impeller 15 and actuated so as to rotate the impeller 15, the casing 21 formed with a suction opening 19 in which the impeller 15 and motor 17 are received therein, and three webs 23a to 23b for connecting a housing 17b of the motor 17 to the casing 21 to position the motor 17 at a central portion of the suction opening 19. The motor 17 may include an internal structure which may be constructed in such a manner as disclosed in Japanese Patent Application Laid-Open publication No. 83873/1996. The impeller 15, as shown in FIG. 4, includes an annular member 16 fitted on an outer periphery of a cup-like member 17d of a rotor 17c of the motor 17 and seven such blades 13 arranged on an outer periphery of the annular member 16 in a manner to be spaced from each other at predetermined intervals in a peripheral direction of the annular member 16. The blades 13 are constructed so as to permit air sucked from the suction opening 19 toward the base 7 in an axial direction of the revolving shaft 17a to be positively discharged in a radial direction of the revolving shaft 17a. Air thus discharged in the radial direction of the revolving shaft 17a acts to positively cool the outer portion of each of the radiation fins 11a46 to 11a3 and 11a16 to 11a33 . Air flowing between each adjacent two of the radiation fins 11a49 to 11a60 and 11a30 to 11a19 is guided between each adjacent two of the radiation fins 11b1 to 11b12 and 11c1 to 11c12 and then outwardly discharged. Air contacted with the remaining radiation fins is outwardly discharged through two passages defined between the radiation fins 11ba and 11c1 and the side wall 9B of the heat sink 3 and through two passages defined between the radiation fins 11b12 and 11c12 and the side wall 9A of the heat sink 3. This results in the side walls 9A and 9B of the heat sink 3 each acting also as a radiation fin which contributes to heat dissipation.

The casing 21 includes a horizontal wall 21A arranged opposite to the front surface of the heat sink 3 with a predetermined interval being defined therebetween, a pair of side walls 21B and 21C arranged so as to downwardly extend toward the heat sink 3 from both lateral side ends of the horizontal wall 21A extending in a width or lateral direction thereof, and an annular wall 21D arranged so as to upwardly extend from the horizontal wall 21A in a direction away from the heat sink 3 and formed so as to define the suction opening 19 therein. The casing 21, the webs 23a to 23c and the housing 17b of the motor 17 may be integrally formed of a synthetic resin material. The side walls 21B and 21C of the casing 21 and the side walls 9A and 9B of the heat sink 3 are arranged so as to permit air fed from the plural blades 13 to be outwardly discharged through only two lateral discharge ports 25 and 27 (FIG. 1C). The discharge ports 25 and 27 are formed so as to be open in directions contrary to each other at positions at which the extensions 7B and 7C of the heat sink 3 end in directions contrary to each other.

The casing 21 includes a pair of guide extensions 21E and 21F for air guide which are arranged so as to extend beyond the two discharge ports 25 and 27 to both ends of the base 7 defined in the longitudinal direction thereof. The guide extensions 21E and 21F act to permit air discharged from the discharge ports 25 and 27 to be guided in directions contrary to each other in the longitudinal direction of the casing 21. The guide extensions 21E and 21F include horizontal extension sections 21E*a* and 21F*a* extending from the horizontal wall 21A, as well as a pair of side extension sections 21B*a* and 21B*b* extending from the side wall 21B and a pair of side extension sections 21C*a* and 21C*b* extending from the side wall 21C, respectively. The guide extensions 21E and 21F each are formed into a length which prevents air discharged from the guide extensions 21E and 21F from being sucked directly into the suction opening 19.

Arrangement of the guide extensions on the casing 21 restrains air heated by the heat sink 3 and discharged from the discharge ports 25 and 27 from being sucked directly into the suction opening 19 while eliminating a necessity of excessively increasing a length of the base 7 of the heat sink 3. This results in the electronic component cooling apparatus of the illustrated embodiment exhibiting heat dissipation with increased efficiency. In the illustrated embodiment, the horizontal wall 21A and side walls 21B and 21C of the casing 21 are arranged so as to extend beyond the extension 7B and 7C of the base 7 of the heat sink 3, to thereby constitute the guide extensions 21E and 21F. The side extension sections 21B*a* and 21B*b* of the guide extension 21E and the side extension sections 21C*a* and 21C*b* of the guide extension 21F each are formed into a height which permits it to extend to a level in proximity to the front surface of the base 7 of the heat sink 3.

Figure 6:
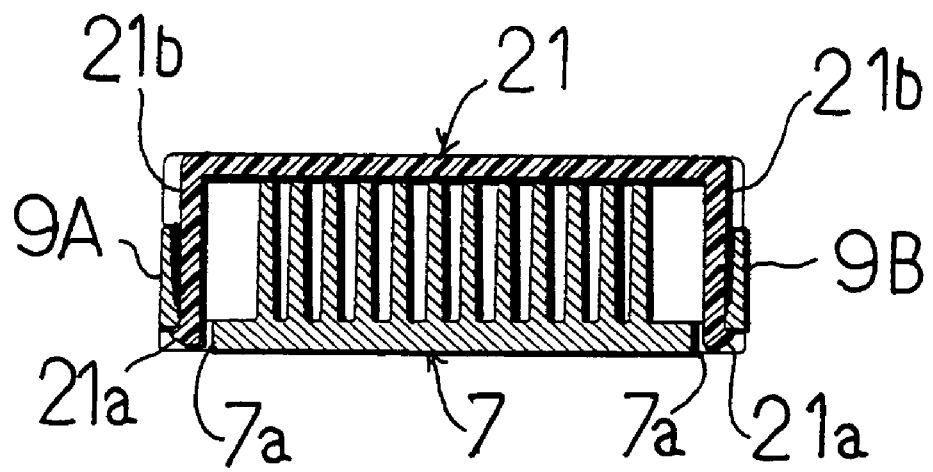
FIG. 6 is a sectional view taken along line VI—VI of FIG. 1A.

The side walls 21B and 21C of the casing 21, as shown in FIGS. 1B and 1C, each are integrally provided with two fitting portions or engagement projections 21*a* in a manner to be spaced from each other at an interval in the longitudinal direction thereof provided. The projections 21*a* each are formed into a hook-like shape and arranged so as to outwardly project from an inside of each of the side walls 9A and 9B of the heat sink 3. The side walls 9A and 9B of the base 7 of the heat sink 3 each are provided on an inside thereof with two fitted portions or engagement through-holes 7*a* releasably engaged with the projections 21*a* for engagement provided on each of the side walls 21B and 21C of the casing 21, as shown in FIGS. 1C, 3 and 6, respectively. The through-holes 7*a* each are formed on an outer end thereof defined on the rear surface of the base 7 with an outwardly open groove 7*b*, in which a hook-like distal end of the projection 21*a* for engagement is received. The side walls 21B and 21C of the casing 21 each are formed with a recess 21*b* adapted to facilitate deformation of the projection 21*a*.

Now, fitting of the engagement projections 21*a* of the casing 21 in the engagement through-holes 7*a* of the heat sink 3 by manual operation will be described.

First, the side extension sections 21B*a* and 21C*a* of one guide extension 21E are interposedly held by the thumb and index finger of one hand of an operator and the side elongation sections 21B*b* and 21C*b* of the other guide extension 21F are interposedly held by the thumb and index finger of the other hand. Then, force is applied to the side extension sections 21B*a*, 21C*a* and 21B*b*, 21C*b*, to thereby bring the side extension sections 21B*a* and 21C*a* close to each other and bring the side extensions 21B*b* and 21C*b* close to each other. Then, the casing 21 is moved to a position close to the heat sink 3, so that the engagement projections 21*a* of the casing 21 are fitted in the engagement through-holes 7*a* of the heat sink 3. Thereafter, the force applied to the side extension sections is released therefrom. Such operation permits the engagement projections 21*a* of the casing 21 to be engagedly fitted in the engagement through-holes 7*a* of the heat sink 3. Such engagement therebetween may be released by applying force to the side extension sections 21B*a*, 21C*a* and 21B*b*, 21C*b* so as to approach the side extension sections 21B*a* and 21C*a* to each other and approach the side extension sections 21B*b* and 21C*b* to each other. Then, the casing 21 is separated from the heat sink 3, resulting in the engagement projections 21*a* of the casing 21 being released from engagement with the engagement through-holes 7*a*.

Also, in the illustrated embodiment, of three such webs 23*a* to 23*b*, one web 23*b* has three connection conductors 29 received therein, which are electrically connected to a circuit arranged on the motor 17, as shown in FIG. 1A. The annular wall 21D is integrally formed with an expansion 31 for formation of a connector. The connection conductors 29 each are positioned at an outer end thereof in a recess formed at an upper end of the expansion 31.

Figure 5:
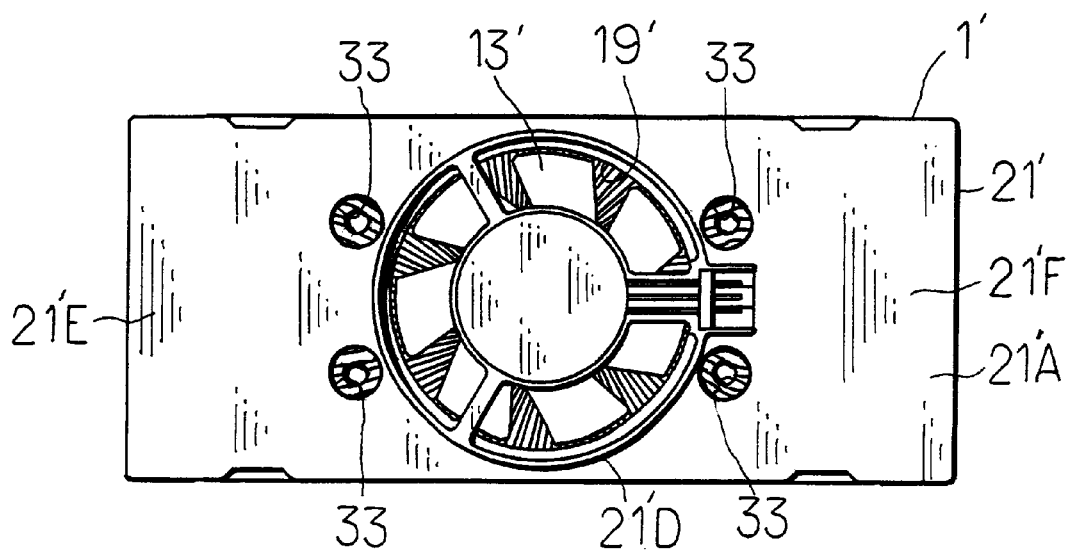
FIG. 5 is a plan view showing another embodiment of an electronic component cooling apparatus according to the present invention.

Referring now to FIG. 5, another embodiment of an electronic component cooling apparatus according to the present invention is illustrated. In an electronic component cooling apparatus of the illustrated embodiment, a horizontal wall 21'A of a casing 21' is formed with four through-holes 33 in proximity to an annular wall 21'*d* or a suction opening 19'. The through-holes 33 are used for mounting, as well as for suction. A position of the through-holes 33 and a configuration thereof are so determined that air flowing between the horizontal wall 21'A and a base of a heat sink permits a negative pressure to be generated in the through-holes 33. Thus, rotation of a fan unit due to rotation of a motor leads to suction of air into the casing 21' through both suction opening 19' and through-holes 33. Arrangement of the through-holes 33 used for suction as well as for mounting when a pair of extensions of the heat sink are reduced in length is carried out by increasing a length of a pair of guide extensions 21'E and 21'F of the casing 21'. More specifically, a length of the guide extensions 21'E and 21'F is determined so as to prevent air discharged from the guide extensions 21'E and 21'F from being immediately sucked into the through-holes 33.

Engagement projections and engagement holes may be arranged on the heat sink and casing, respectively. However, the heat sink is made of a metal material such as aluminum or the like, therefore, the engagement projections are preferably provided on the casing from a practical point of view. This facilitates assembling between the casing and the heat sink.

Figure 7:
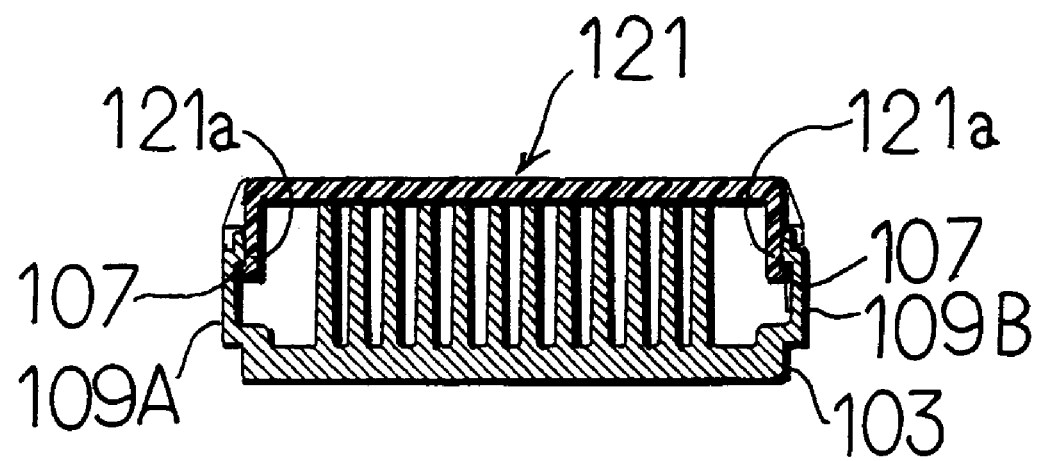
FIG. 7 is a sectional view showing a further embodiment of an electronic component cooling apparatus according to the present invention, wherein a casing and a heat sink are engaged with each other.

Referring now to FIG. 7, a further embodiment of an electronic component cooling apparatus according to the present invention is illustrated. In an electronic component cooling apparatus of the illustrated embodiment, steps 107 are provided on side walls 109A and 109B of a heat sink 103 so as to act as a fitted portion of the heat sink 103, so that hook-like engagement projections 121*a* formed on a casing 121 are engaged with the steps 107, respectively.

In each of the embodiments described above, even when the air discharge ports are restricted in two directions, arrangement of the extensions on the heat sink significantly increases an area of contact between air discharged from the fan unit and the heat sink. Also, the embodiments each are so constructed that the discharge ports each are arranged at the end of each of the extensions and a distance between each of the discharge ports and the suction opening is significantly increased. Such construction prevents air heated by the heat sink from being sucked into the suction opening immediately after it is discharged from the discharge ports. Further, arrangement of the guide extensions on the casing for guiding heated air discharged from the discharge ports prevents air discharged from the discharge ports from being immediately sucked into the suction opening without a necessity of substantially increasing a length of the extensions.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An electronic component cooling apparatus comprising:
    a heat sink including an elongated base;
    said base having a rear surface mounted thereon with an electronic component to be cooled and a front surface provided thereon with a plurality of radiation fins; and
    a fan unit including an impeller provided with a plurality of blades, a motor including a housing and a revolving shaft fixedly mounted thereon with a rotor on which said impeller is mounted and acting to rotate said impeller, a casing provided with a suction opening for receiving said impeller and motor therein and including a horizontal wall arranged opposite to said front surface of said base of said heat sink, and a plurality of webs for connecting said housing of said motor and said casing to each other so as to position said motor at a central portion of said suction opening;
    said blades being constructed so as to suck air from an outside of said suction opening through said suction opening toward said base;
    said heat sink and said casing of said fan unit cooperating with each other to cool said radiation fins of said heat sink by means of air discharged from said impeller being rotated and define two discharge ports on both ends of said base defined in a longitudinal direction thereof;
    said casing being provided with a pair of guide extensions for air guide which are arranged so as to extend beyond said discharge ports to said both ends of said base in the longitudinal direction thereof.

2. An electronic component cooling apparatus as defined in claim 1, wherein said radiation fins of said heat sink are classified into a first radiation fin group arranged in a manner to positionally correspond to a portion of said base on which the electronic component is mounted, and second and third radiation fin groups arranged so as to positionally correspond to said extensions of said casing, respectively;
    the radiation fins constituting said first radiation fin group being arranged so as to minimize interruption of flowing of said air discharged in a radial direction of said revolving shaft of said motor of said fan unit;
    the radiation fins constituting said second and third radiation fin groups being arranged so as to guide said air toward said discharge ports.

3. An electronic component cooling apparatus as defined in claim 2, wherein said radiation fins of at least said second and third radiation fin groups are formed into a height which permits said radiation fins to be contacted with said horizontal wall of said casing or positioned in proximity thereto.

4. An electronic component cooling apparatus as defined in claim 2, wherein said radiation fins of said second and third radiation fin groups are connected to said radiation fins of said first radiation fin group to form a plurality of flow passages continuous therebetween, respectively.

5. An electronic component cooling apparatus as defined in claim 2, wherein said casing includes an annular wall arranged so as to define said suction opening therein; and
    said horizontal wall of said casing is formed with at least one suction through-hole in proximity to said annular wall;
    said suction through-hole being formed into a configuration which permits air flowing between said horizontal wall and said base to generate a negative pressure in said suction through-hole.

6. An electronic component cooling apparatus comprising:
    a heat sink including an elongated base having a rear surface mounted thereon with an electronic component to be cooled and a front surface mounted thereon with a plurality of radiation fins and a pair of side walls which are provided so as to upwardly extend from both sides of said base extending in a longitudinal direction thereof and between which said radiation fins are arranged;
    said base including a pair of extensions positioned on both sides of an electronic component mounting section of said base and extending in the longitudinal direction thereof;
    a fan unit including an impeller provided with a plurality of blades, a motor including a revolving shaft fixedly mounted thereon with a rotor on which said impeller is mounted and acting to rotate said impeller, a casing provided with a suction opening for receiving said impeller and motor therein, and a plurality of webs for connecting said housing of said motor and said casing to each other so as to position said motor at a central portion of said suction opening, said casing being fixed on said heat sink;
    said blades being constructed so as to suck air from an outside of said suction opening through said suction opening toward said base;
    said casing including an elongated horizontal wall arranged so as to be opposite to said front surface of said base of said heat sink while being spaced therefrom at a predetermined interval, a pair of side walls arranged so as to extend toward said heat sink from both sides of said horizontal wall extending in a longitudinal direction thereof, and an annular wall arranged so as to extend in a direction away from said heat sink to define said suction opening therein;
    said heat sink and said casing of said fan unit cooperating with each other to directly cool many of said radiation fins of said heat sink by means of air discharged from said blades of said impeller being rotated and define two discharge ports on both ends of said base defined in a longitudinal direction thereof;
    said casing being provided with a pair of guide extensions which are arranged so as to extend beyond both ends of said side walls of said heat sink extending in the longitudinal direction thereof to further guide air discharged from said discharge ports toward both sides in the longitudinal direction thereof.

7. An electronic component cooling apparatus as defined in claim 6, wherein said side walls of said casing each are provided with a plurality of fitting portions in a manner to be spaced from each other in the longitudinal direction thereof;

one of said base and side walls of said heat sink is provided with a plurality of fitted portions respectively engaged with said fitting portions; and said guide extensions of said casing each include a horizontal extension section extending from said horizontal wall of said casing and a pair of side extension sections extending from each of side walls of said casing;

said fitting portions and fitted portions being so constructed that engagement between said fitting portions and said fitted portions is released by separating said casing from said heat sink while applying force to said side extension sections of said guide extensions in directions toward each other.

8. An electronic component cooling apparatus as defined in claim 6, wherein said radiation fins of said heat sink are classified into a first radiation fin group arranged in a manner to positionally correspond to a portion of said base on which the electronic component is mounted, and second and third radiation fin groups arranged so as to positionally correspond to said extensions of said casing, respectively;

the radiation fins constituting said first radiation fin group being arranged so as to minimize interruption of flowing of said air discharged in a radial direction of said revolving shaft of said motor of said fan unit;

the radiation fins constituting said second and third radiation fin groups being arranged so as to guide said air toward said discharge ports.

9. An electronic component cooling apparatus as defined in claim 8, wherein said radiation fins of at least said second and third radiation fin groups are formed into a height which permits said radiation fins to be contacted with said horizontal wall of said casing or positioned in proximity thereto.

10. An electronic component cooling apparatus as defined in claim 8, wherein said radiation fins of said second and third radiation fin groups are connected to said radiation fins of said first radiation fin group to form a plurality of flow passages continuous therebetween, respectively.

11. An electronic component cooling apparatus as defined in claim 8, wherein said casing includes an annular wall arranged so as to define said suction opening therein; and said horizontal wall of said casing is formed with at least one suction through-hole in proximity to said annular wall;

said suction through-hole being formed into a configuration which permits air flowing between said horizontal wall and said base to generate a negative pressure in said suction through-hole.

* * * * *

UNITED STATES PATENT AND TRADEMARK OFFICE
CERTIFICATE OF CORRECTION

PATENT NO. : 6,109,341
DATED : August 29, 2000
INVENTOR(S) : Kodaira et al.

It is certified that error appears in the above-indentified patent and that said Letters Patent is hereby corrected as shown below:

```
On Title Page, Section [56] References Cited,
    U.S. PATENT DOCUMENTS, delete
       "5,309,985  5/1994  Bailey  165/80.3".
```

Signed and Sealed this

Twenty-fourth Day of April, 2001

Attest:

NICHOLAS P. GODICI

Attesting Officer     Acting Director of the United States Patent and Trademark Office